(12) United States Patent
Petersen

(10) Patent No.: US 7,372,354 B2
(45) Date of Patent: May 13, 2008

(54) DETECTOR CIRCUIT TO BE USED FOR MEASURING CURRENT

(75) Inventor: Jan Raagaard Petersen, Kirke Hyllinge (DK)

(73) Assignee: Danfysik A/S, Jyllinge (DK)

( * ) Notice: Subject to any disclaimer, the term of this patent is extended or adjusted under 35 U.S.C. 154(b) by 0 days.

(21) Appl. No.: 11/299,901

(22) Filed: Dec. 13, 2005

(65) Prior Publication Data
US 2006/0152182 A1    Jul. 13, 2006

(30) Foreign Application Priority Data
Jan. 7, 2005    (DK) .............................. 2005 00029

(51) Int. Cl.
*H01F 27/28*    (2006.01)
(52) U.S. Cl. .................... 336/229; 324/117 R
(58) Field of Classification Search ................. 336/229
See application file for complete search history.

(56) References Cited

U.S. PATENT DOCUMENTS

| | | | |
|---|---|---|---|
| 1,955,317 A * | 4/1934 | Wentz | 336/73 |
| 3,146,417 A * | 8/1964 | Pearson | 333/24 R |
| 4,912,396 A * | 3/1990 | Groenenboom | 324/117 R |
| 5,060,299 A * | 10/1991 | Enderson | 455/326 |
| 5,764,123 A | 6/1998 | Waters | |

FOREIGN PATENT DOCUMENTS

| | | |
|---|---|---|
| EP | 1 494 033 A1 | 1/2005 |
| JP | 63-17510 A | 1/1988 |

* cited by examiner

*Primary Examiner*—Elvin Enad
*Assistant Examiner*—Joselito S Baisa
(74) *Attorney, Agent, or Firm*—Birch, Stewart, Kolasch & Birch, LLP

(57) ABSTRACT

A detector circuit to be used for measuring current and including a main current transformer and two substantially identical auxiliary current transformers, where magnetomotive forces are induced by a main current, said magnetomotive forces being counteracted by magnetomotive forces induced by a compensating current ($i_4$) in a compensating winding (L4) across at least two annular cores (2, 3) at the same time as the two auxiliary current transformers are magnetized in antiphase by means of a modulation signal, said circuit further including a synchronous rectifier for providing an adjustment signal for the compensating current ($i_4$). According to the invention, the compensating winding (L4) is formed by a so-called "pilgrim winding". A pilgrim winding results from one section being wound at a time, and it presents the property that the potential difference between the individual winding layers is smaller than in connection with conventionally wound transformers where one layer is wound at a time in the longitudinal direction of the entire core. As a result the undesirable capacitive currents between the windings have been significantly reduced, viz. the so-called neighbouring effect. In other words, the parasitic capacities between the windings have been reduced. In addition it turned out that the use of such windings implies that the undesirable resonances are elevated to such an extent that they no longer interfere with the measuring procedure.

4 Claims, 9 Drawing Sheets

DETECTOR CIRCUIT TO BE USED FOR MEASURING CURRENT

TECHNICAL FIELD

The invention relates to a detector circuit to be used for measuring current by means of a main current transformer and two substantially identical auxiliary transformers, where magnetomotive forces are induced by a main current, said magnetomotive forces being counteracted by magnetomotive forces induced by a compensating current in a winding surrounding at least two annular cores at the same time as the two auxiliary transformers are magnetized in antiphase by means of a modulation signal, said circuit including a synchronous rectifier for providing an adjustment signal for the compensating current.

BACKGROUND ART

Danish Patent No. 149238 discloses a zero-flux current transformer for measuring the current for an electromagnet in a particle accelerator. As very heavy current intensities are involved, viz. several hundred amperes, the main current is advantageously converted into a comparatively weaker measuring current which is easy to handle, and which is passed through a measuring resistor. Then the voltage drop across the measuring resistor is used as a measurement representing the intensity of the main current.

The known zero-flux current transformers are formed by a second harmonic magnetic modulator in combination with a magnetic integrator. In principle a magnetic integrator includes an annular core of a ferromagnetic material and is provided with a primary winding, a secondary winding and a sensor winding. The sensor winding communicates with the inlet terminals of an amplifier driving the secondary current through a measuring resistor. Then an alteration of the magnetic flux in the annular core induces a voltage in the sensor winding, and this voltage affects the amplifier in such a manner that said magnetic flux generates a compensating current which counteracts the alteration of the flux caused by the primary current. Thus the magnetomotive forces generated by the current through the primary winding are equalized by the magnetomotive forces generated by the current through the secondary winding in such a manner that a specific relationship exists between the current intensity in the primary winding and the current intensity in the secondary winding.

However, the magnetic integrator cannot handle DC and very low frequencies, and accordingly it is necessary to include a separate circuit for this function. Such a circuit is formed by a magnetic modulator including two identically coated annular cores and a driver circuit. The annular cores are driven in saturation, and at a balance/"zero flux" the current curves are symmetrical relative to zero with the result that the contents of equal harmonics are zero. Then it is possible to use either a direct, symmetrical detection by means of a window comparator/Schmitt trigger or a second harmonic detector using synchronous rectification of the current signal presenting the double frequency of the modulation signal. In both cases an output signal is obtained which is zero at a balancing between the primary and the secondary ampere winding number. An unbalance between the ampere winding numbers results in a voltage of an amplitude and a polarity which depend on the extent and polarity of said unbalance. One core suffices for carrying out the latter detector function, but it is necessary to involve two cores in antiphase in order to prevent the compensating circuit from suppressing the detection and in order to prevent the modulation signal from disturbing the magnetic integrator through a magnetic coupling.

However, the known circuits are encumbered with the draw-back that it is not possible to compensate for alternating currents of a particularly high frequency. In addition, undesirable resonances are generated which can have a destroying effect.

DISCLOSURE OF INVENTION

The object of the invention is to provide a detector circuit of the above type which is capable of compensating for alternating currents to a hitherto unknown degree.

The invention is based on the recognition that the undesirable resonances are caused by parasitic capacities in the common winding surrounding at least two annular cores, and according to the invention these parasitic capacities may be highly reduced by the winding for the compensating current being wound in such a manner that said parasitic capacities are reduced to a minimum, for instance by said winding being a so-called "pilgrim winding". A pilgrim-wound transformer resulting from one section being wound at a time presents the property that the potential difference between the individual winding layers is smaller than in connection with conventionally wound transformers where one layer is wound at a time in the longitudinal direction of the entire core. As a result the undesirable capacitive currents between the windings have been significantly reduced. In other words, the parasitic capacities are reduced. In addition it turned out that the use of such a winding implies that the undesirable resonances are elevated to such an extent that they no longer interfere with the measuring procedure.

The winding surrounding at least the two annular cores can optionally be formed by a so-called "cross-winding".

BRIEF DESCRIPTION OF THE DRAWINGS

The invention is explained in detail below with reference to the drawings, in which.

BEST MODE FOR CARRYING OUT THE INVENTION

Figure 1:
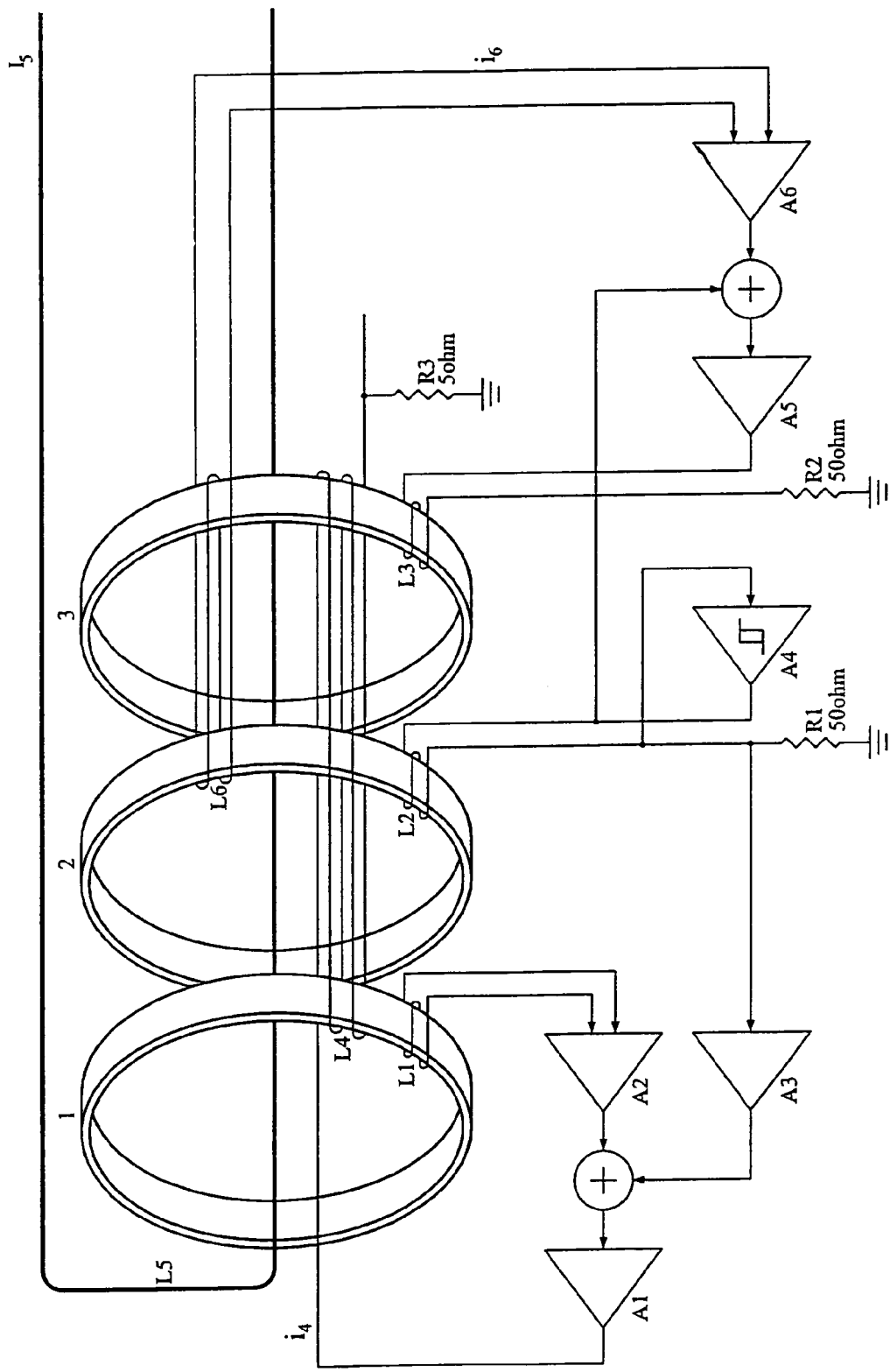
FIG. 1 illustrates an astable detector circuit with a zero detector noise reduction and including three cores.
Figure 2:
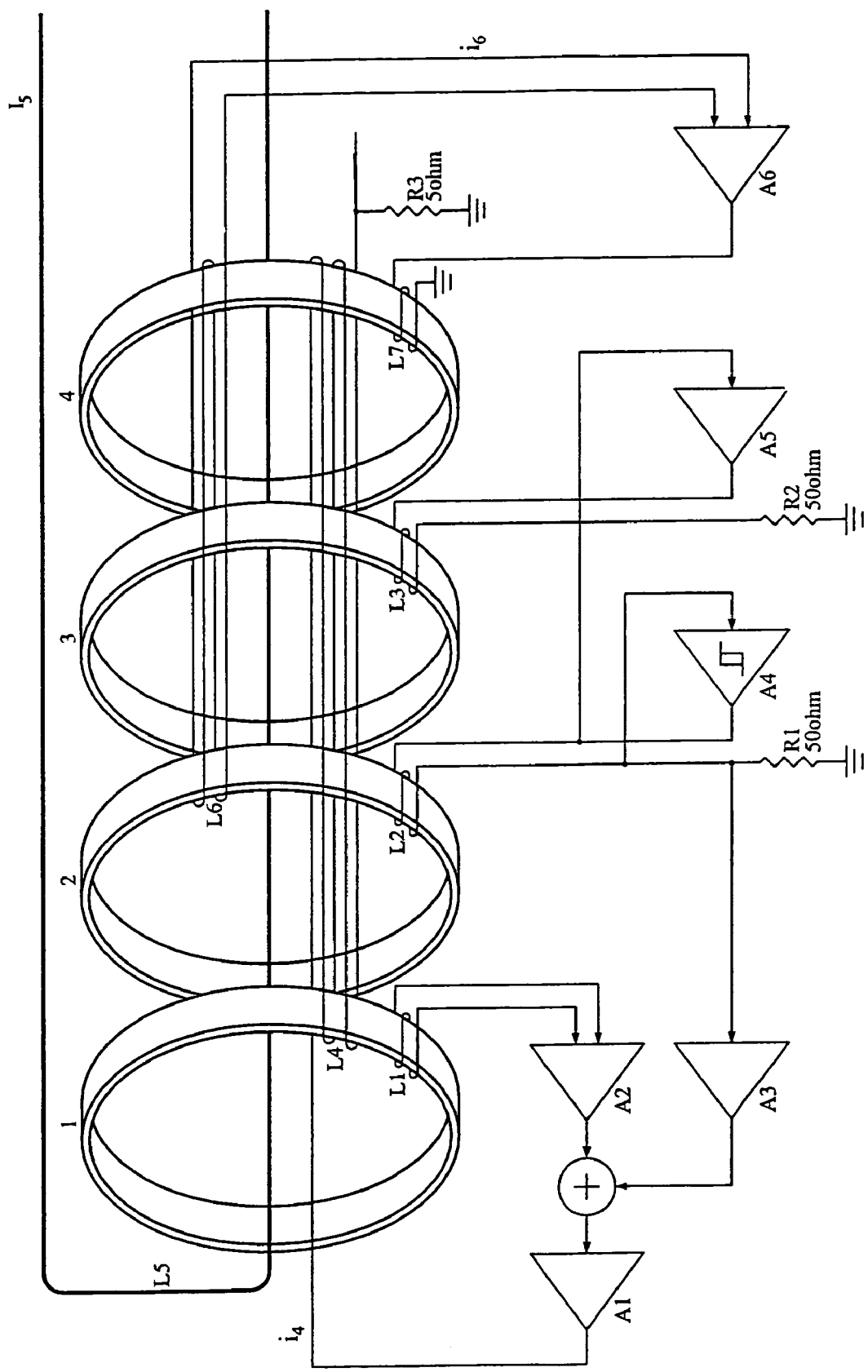
FIG. 2 illustrates an astable detector circuit with a zero detector noise reduction and including four cores.

The detector circuit shown in FIG. 1 is to be used for measuring strong currents, and it includes three substantially identical annular cores 1, 2, 3. A main current $I_s$ runs through the three substantially identical annular cores and induces magnetomotive forces which are to be counteracted by a compensating current $i_4$. A modulation signal in form of a square wave signal of a frequency of a few hundred Hz is fed to the windings L2, L3 of two of these cores 2, 3, the square wave signal fed to the winding L2 of one core 2 being inverted relative to the square wave signal fed to the winding L3 of the second core 3. As a result, the two cores 2, 3 are magnetized in antiphase in such a manner that both the unequal and the equal harmonics are substantially compensated for through a coupling via the windings L1, L4 and L5.

The principle is based on the fact that the average flux in the cores is zero when equilibrium or a balance exists between the fields induced by the main current and the compensating current. However, when the average flux differs from zero due to an unbalance between the induced fields, i.e. when an unbalance appears between the ampere winding numbers of the main current $I_5$ and the compensating current $i_4$ in the winding L4 across at least the two annular cores 3, 2, then the magnetizing current in the modulation windings include equal harmonics, where the second harmonic is the most important factor. A detection of the latter second harmonic results in a DC signal corresponding to the unbalance being diverted, said DC signal being used for controlling an amplifier in such a manner that the balance between the magnetomotive forces induced by the primary current and the secondary current is re-established.

The compensating winding L4 is wound in such a manner that the parasitic capacities are reduced to a minimum, such as by the winding L4 being wound as a pilgrim winding or a progressive winding. The winding L4 can optionally be wound as a cross-winding or a so-called "sectional winding".

A concrete embodiment of such a detector circuit appears from FIG. 1. The modulation signal is generated by means of a Schmitt trigger A4, the output of which communicates with one terminal of the winding L2, and the input of which communicates with the second terminal of the winding L2. The circuit is astable. At the moment a positive voltage is applied onto pa L2, a positive voltage is applied to the input of the Schmitt trigger A4. This positive voltage has the effect that a current runs in the winding L2 and causes the core 2 to be saturated, whereby the voltage drop across the winding L2 decreases to almost zero and the voltage drop across the resistance R1 (50 Ω) increases. Subsequently the Schmitt trigger A4 alters its state in such a manner that an astable circuit is provided.

The square wave signal at the output of the Schmitt trigger A4 is also transmitted to the input of an amplifier A5, the output of which feeds the winding L3. As a result, the winding L3 is fed with a square wave signal being in antiphase relative to the square wave signal fed to the winding L2.

The signal voltage across the resistance R1 corresponds to the signal voltage at the inlet of the Schmitt trigger A4. Through a low-pass amplifier A3 the signal voltage across the resistance R1 is also transmitted to an adding unit in which it is added to a signal voltage detected by the winding L1 so as to provide the compensating current in 4. As a result, the latter compensating current is capable of compensating for both slow and fast variations in the main current $I_5$.

Means are according to the invention furthermore provided for compensating for the two annular cores 2, 3 not being completely identical. These means are formed by a common winding L6 across the two annular cores 2, 3. The common winding L6 detects a possible error signal $i_6$, which is added to the modulation signal transmitted to the core 3. The error signal is transmitted in such a manner that a negative feedback loop is established, said negative feedback loop automatically trying to establish equilibrium. In other words, the modulation signal to the core 3 is altered until the error signal is substantially zero.

However, the error signal cannot be exactly zero.

The latter is inter alia due to the fact that mainly the adjustment is only efficient as long as the core 3 is not in saturation, which, if desired, can be compensated for by including yet another annular core 4 not entering saturation because it is not supplied with a modulation signal.

In the latter case, the compensating means are in form of a common winding L6 across the three annular cores 2, 3, 4. This common winding L6 detects a possible error signal originating from the cores 2 and 3, and this error signal is used for affecting the magnetizing in the core 4. As a result, an additional reduction of the error signal is obtained and consequently a very accurate measuring of the main current $I_5$ is obtained.

Figure 3:
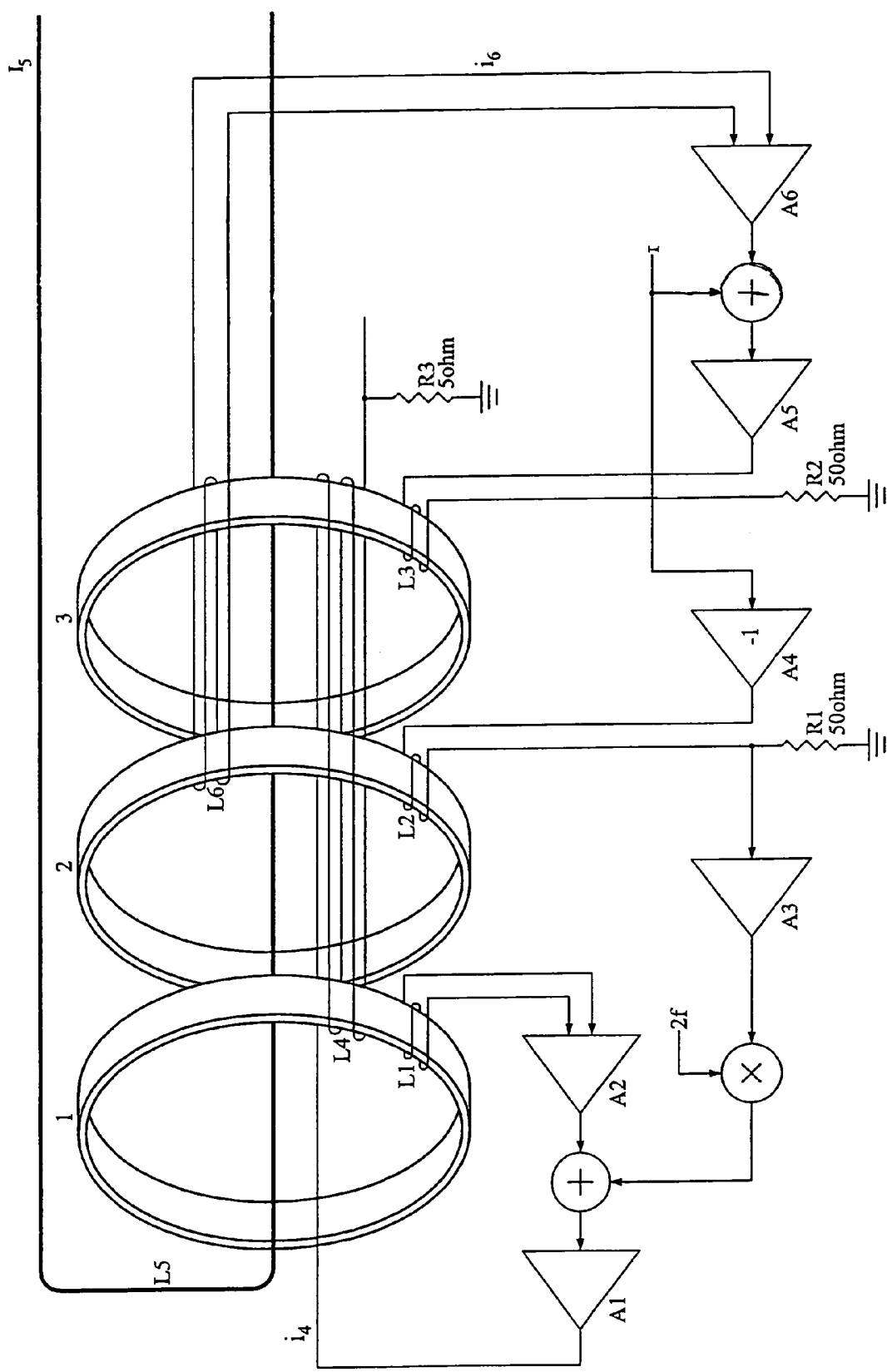
FIG. 3 illustrates a detector circuit including four cores, and where a modulation signal is externally applied.

According to an alternative embodiment, cf. FIG. 3, the astable circuit has been replaced by a circuit which is positively operated from the outside by a modulation signal in form of an AC signal transmitted to the winding L2, said AC signal preferably being a square wave signal presenting a frequency of a few hundred Hz, and by an AC signal, preferably in the form of a square wave signal, being transmitted to the winding L3 and being inverted relative to the above signal. As a result, the two windings L2 and L3 are magnetized in antiphase.

The signal voltage across the resistance R1 is detected and applied to an amplifier A3, whereafter the amplified signal voltage is multiplied with a signal presenting the frequency 2 f, viz. synchronous rectification. The mixed signal is then added to the signal detected by the winding L1.

Also in this case, means can according to the invention be provided for compensating for the two annular cores 2, 3 not being completely identical, cf. FIG. 3. Like in FIG. 1, these means are formed by a common winding L6 across the two annular cores 2, 3, said common winding L6 detecting a possible error signal being added to the modulation signal transmitted to the core 3. The error signal is transmitted in such a manner that a negative feedback loop is established, said negative feedback loop automatically trying to establish an equilibrium. In other words, the modulation signal to the core 3 is altered until the error signal is substantially zero.

As in the circuit configuration shown in FIG. 1, the adjustment is only efficient as long as the core 3 is not in saturation. An additional annular core 4 can be added, cf. FIG. 4, in order to compensate for the above situation, said additional annular core not entering saturation because no modulation signal is transmitted to this core 4.

Figure 4:
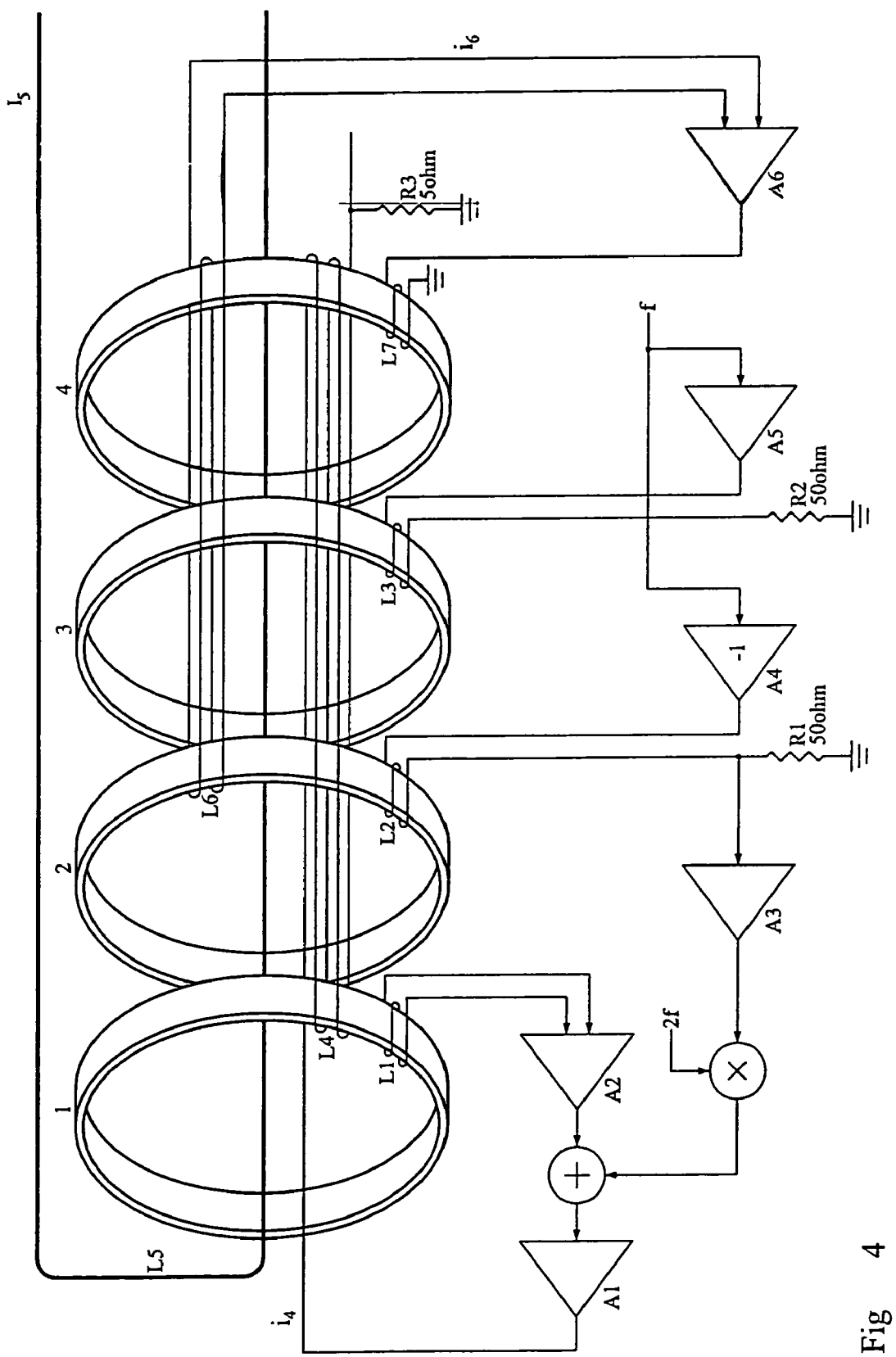
FIG. 4 illustrates a detector circuit including four cores, and where a modulation signal is externally applied.

In the circuit configuration shown in FIG. 4, the above compensating means are formed by a common winding L6 across the three annular cores 2, 3, 4, said common winding L6 detecting a possible error signal originating from the cores 2 and 3 and being utilized for affecting the magnetizing in the core 4.

The described detector circuits can for instance be used for measuring strong currents, viz. magnetizing currents for particle accelerators.

Figure 5:
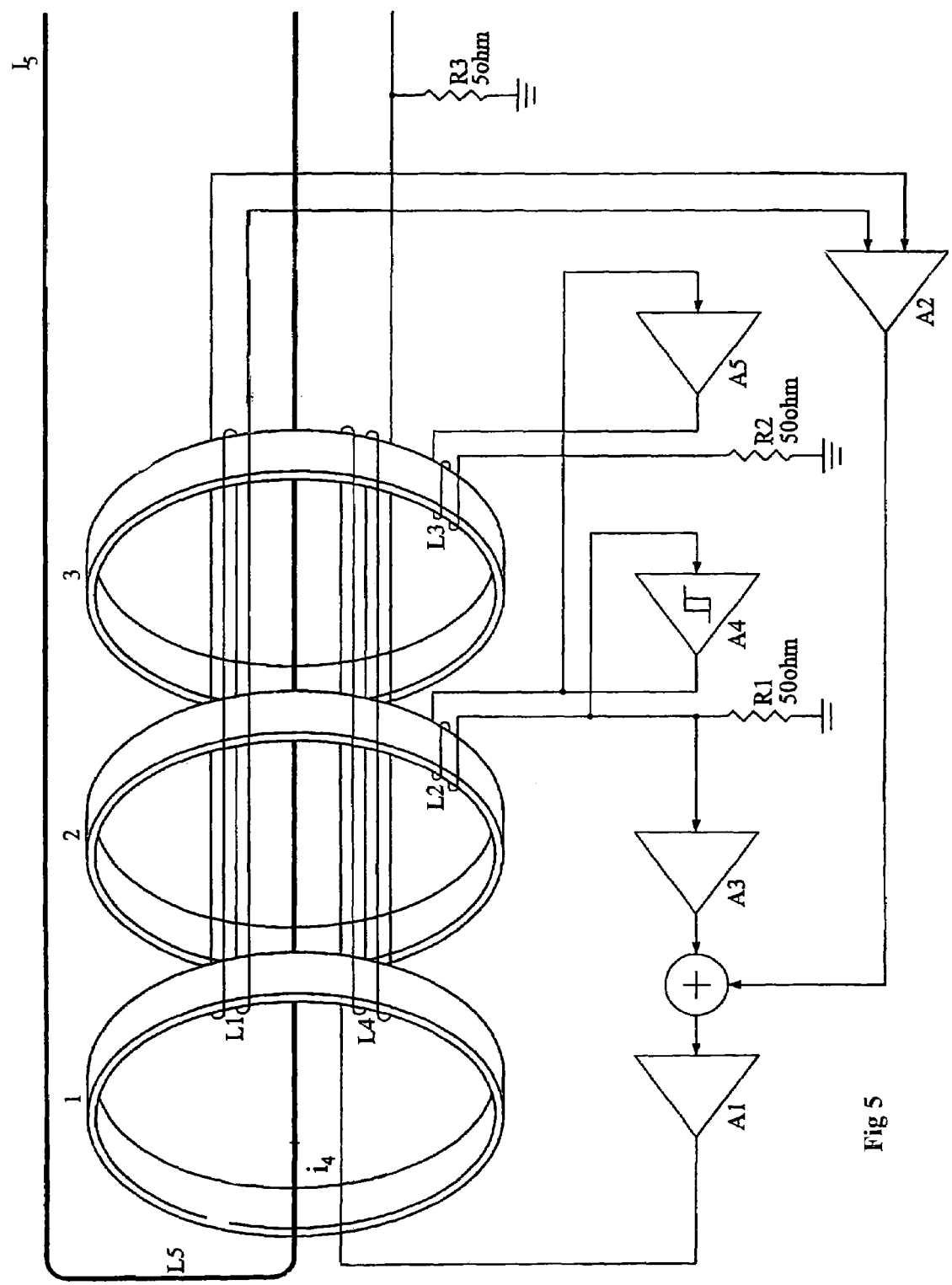
FIGS. 5 and 6 illustrate a simplified embodiment of the current measuring circuit according to the invention.
Figure 6:
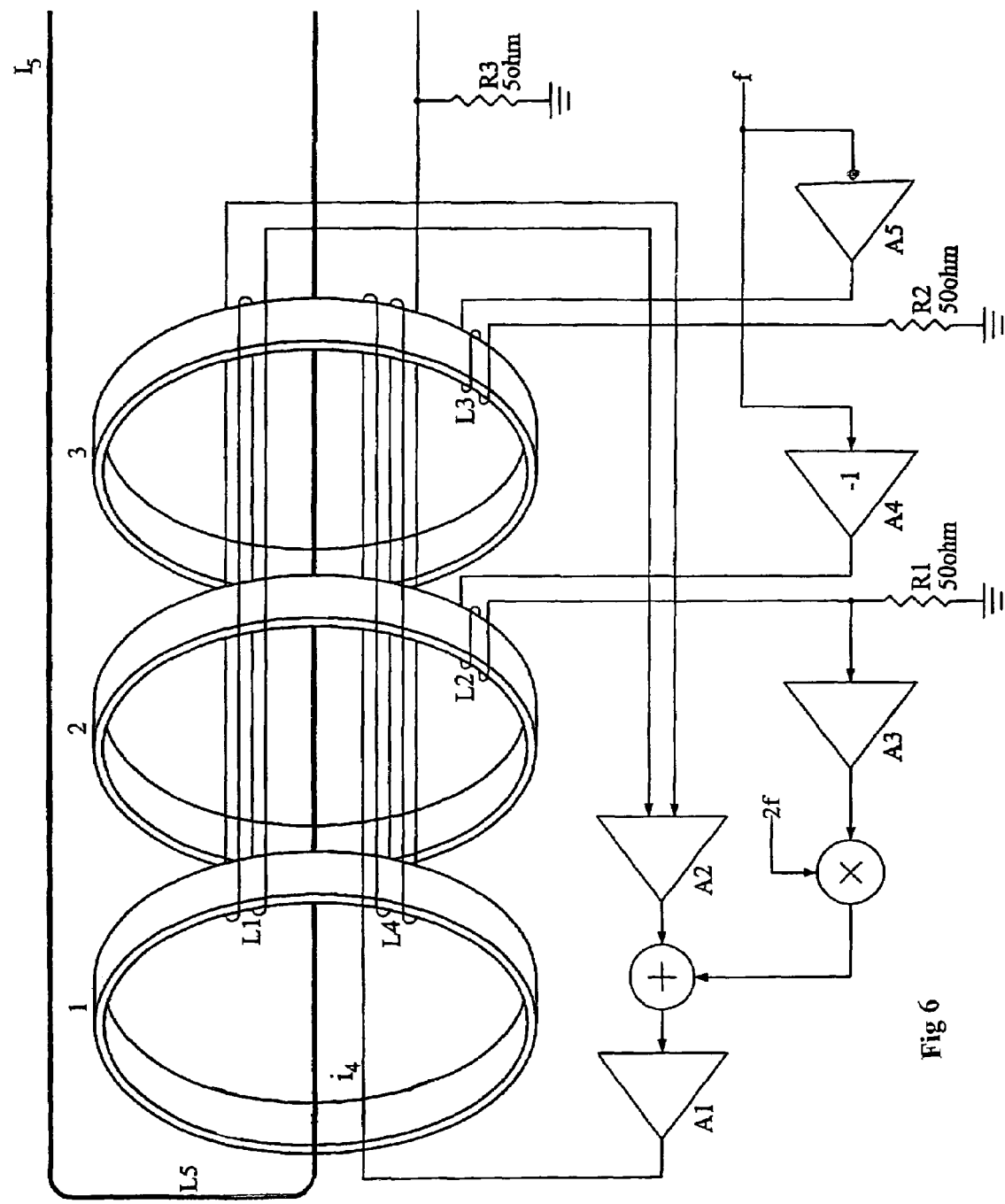
Figure 7A:
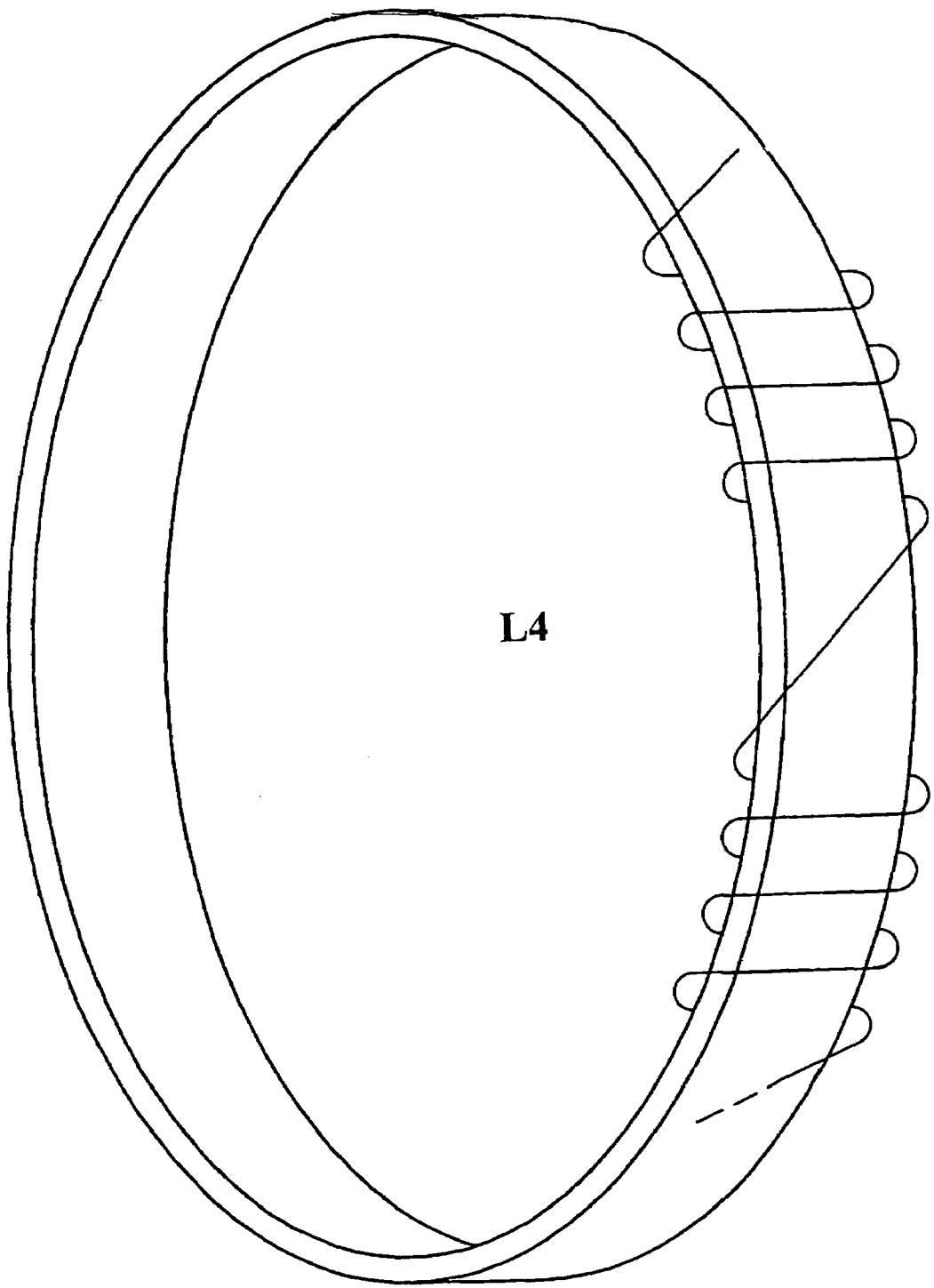
FIGS. 7a, 7b and 7c illustrate examples of a sectional winding, a pilgrim winding and yet another pilgrim winding, respectively.
Figure 7B:
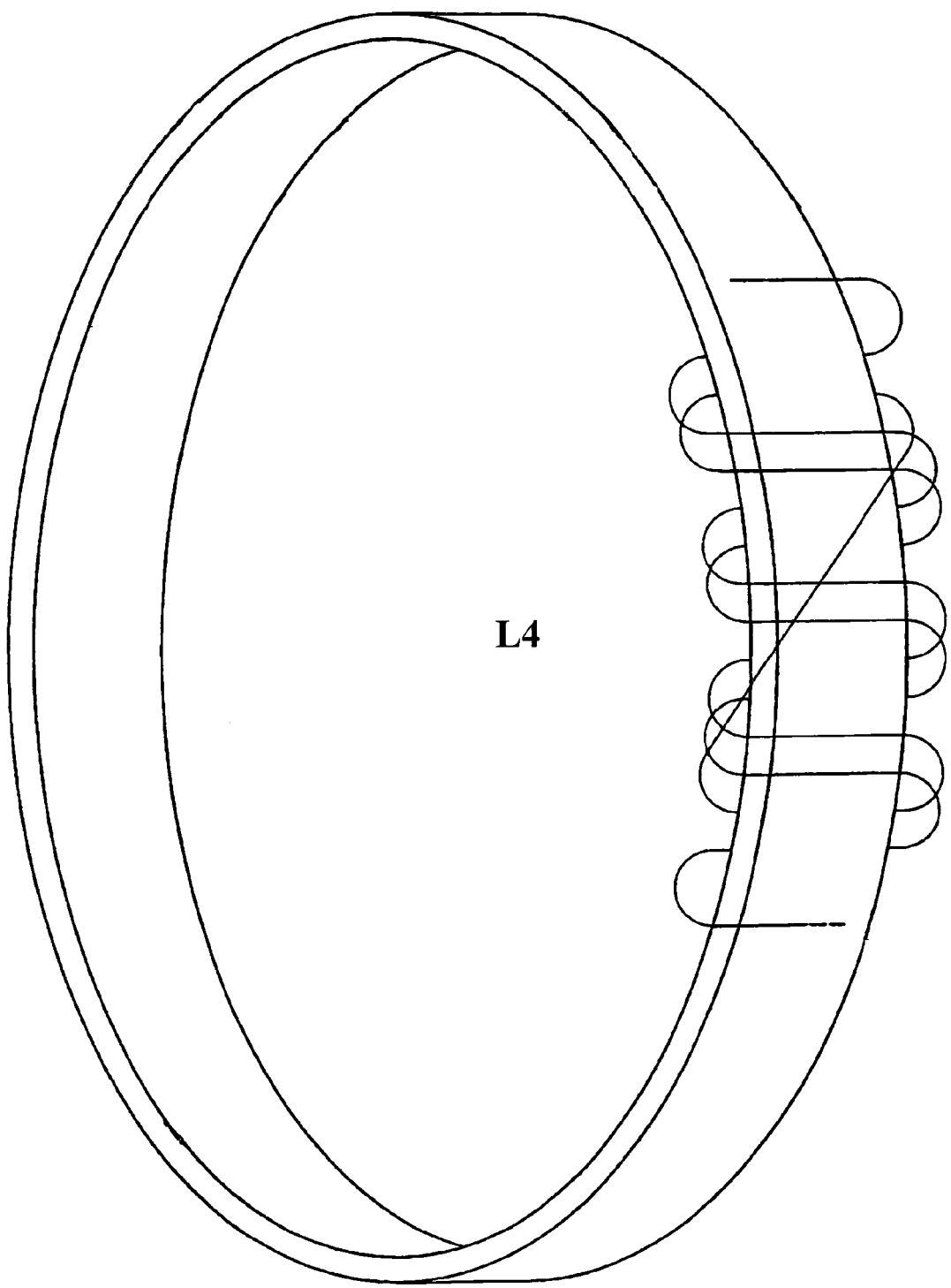
Figure 7C:
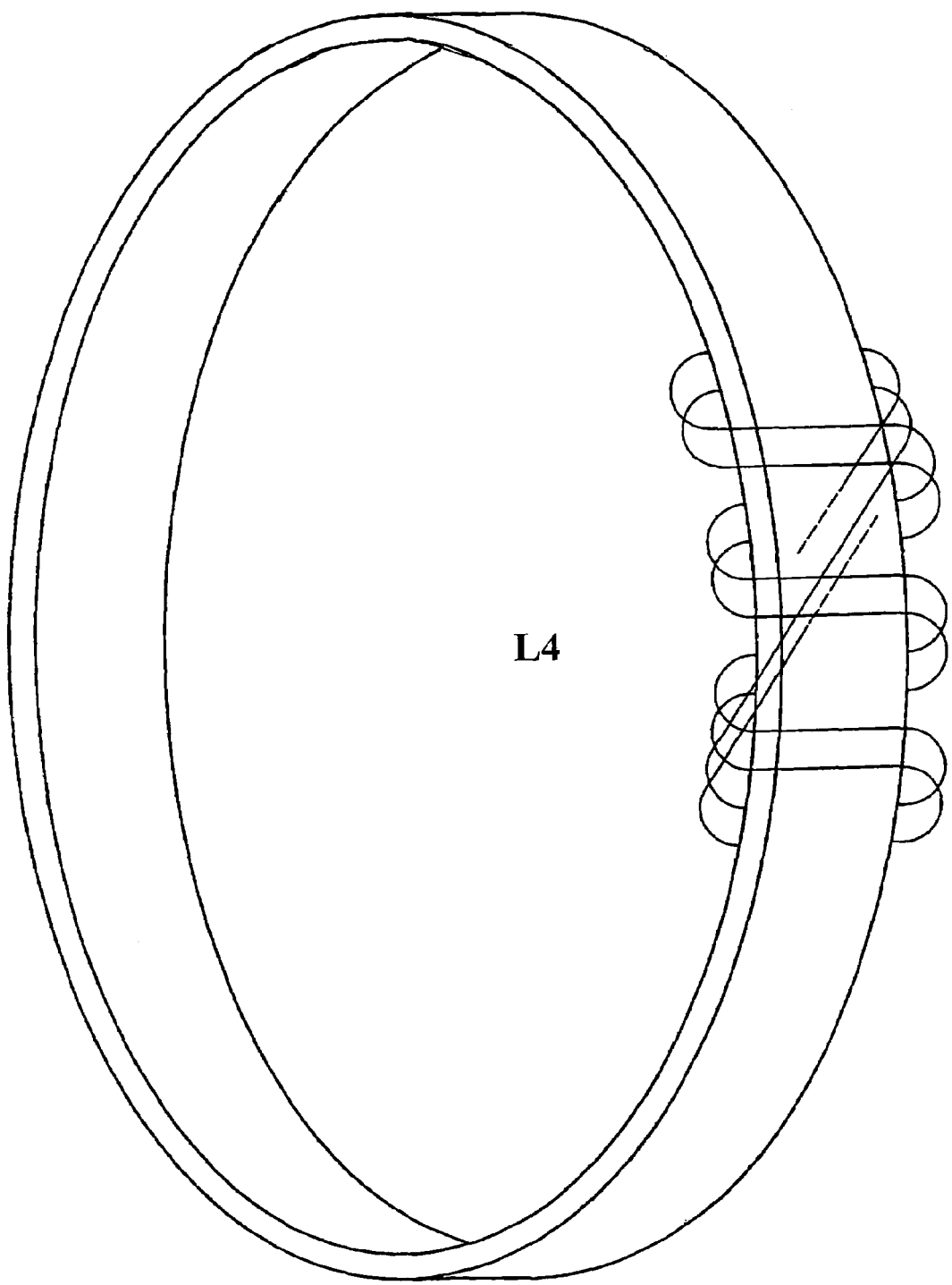

FIGS. 5 and 6 illustrate a simplified embodiment of the current measuring circuit according to the invention.

In some of the above embodiments, the AC-pick-up-winding L1 also be wound in such a manner that the parasitic capacities are reduced to a minimum, such as a pilgrim winding, a sectional winding or a cross-winding.

The invention claimed is:

1. A detector circuit for measuring high current, the circuit comprising:
   a main current transformer;
   two substantially identical auxiliary current transformers each including an annular core, wherein magnetomotive forces are induced by a main current, said magnetomotive forces being counteracted by magnetomotive forces induced by a compensating current in a compensating winding across at least the two annular cores of the auxiliary current transformers at the same time as the two auxiliary current transformers are magnetized in antiphase by means of a modulation signal; and
   a synchronous rectifier for providing an adjustment signal for the compensating current;
   wherein the compensating winding for the compensating current across at least the two annular cores is comprised of a continuous conductive element wound to form a plurality of layers of the conductive element which are non-sequentially wound in relation to each other in such a manner that the potential differences between the plurality of winding layers are reduced to a minimum.

2. A detector circuit according to claim 1, wherein the compensating winding across at least the two annular cores is a pilgrim winding.

3. A detector circuit according to claim 1, wherein the compensating winding across at least the two annular cores is a sectional winding.

4. A detector circuit according to claim 1, further comprising:
   an AC-pick-up winding wound as a pilgrim winding or a cross-winding so as to reduce the potential difference between winding portions close to each other to a minimum.

* * * * *